US007788555B2

(12) United States Patent
Flake

(10) Patent No.: US 7,788,555 B2
(45) Date of Patent: Aug. 31, 2010

(54) USING FRACTIONAL SECTORS FOR MAPPING DEFECTS IN DISK DRIVES

(75) Inventor: Lance Leslie Flake, Longmont, CO (US)

(73) Assignee: Broadcom Corporation, Irvine, CA (US)

( * ) Notice: Subject to any disclaimer, the term of this patent is extended or adjusted under 35 U.S.C. 154(b) by 303 days.

(21) Appl. No.: 11/187,580

(22) Filed: Jul. 22, 2005

(65) Prior Publication Data

US 2007/0033493 A1    Feb. 8, 2007

(51) Int. Cl.
*G11C 29/00* (2006.01)
(52) U.S. Cl. .................................. 714/723; 714/710
(58) Field of Classification Search ................. 714/710, 714/723
See application file for complete search history.

(56) References Cited

U.S. PATENT DOCUMENTS

| | | | | |
|---|---|---|---|---|
| 5,075,804 | A * | 12/1991 | Deyring | 360/49 |
| 5,212,677 | A * | 5/1993 | Shimote et al. | 369/53.17 |
| 5,508,989 | A * | 4/1996 | Funahashi et al. | 369/53.16 |
| 5,523,903 | A * | 6/1996 | Hetzler et al. | 360/77.08 |
| 5,768,043 | A * | 6/1998 | Nemazie et al. | 360/77.08 |
| 5,802,584 | A * | 9/1998 | Kool et al. | 711/154 |
| 5,812,335 | A * | 9/1998 | Kool et al. | 360/51 |
| 5,812,755 | A * | 9/1998 | Kool et al. | 714/8 |
| 5,829,050 | A * | 10/1998 | Maeda | 711/171 |
| 5,844,911 | A * | 12/1998 | Schadegg et al. | 714/710 |
| 5,848,031 | A * | 12/1998 | Kondo et al. | 369/30.09 |
| 5,870,583 | A * | 2/1999 | Maeda | 711/170 |
| 5,883,865 | A * | 3/1999 | Kondo et al. | 369/30.08 |
| 5,897,652 | A * | 4/1999 | Maeda | 711/100 |
| 5,915,263 | A * | 6/1999 | Maeda | 711/154 |
| 5,956,196 | A * | 9/1999 | Hull et al. | 360/65 |
| 6,092,195 | A * | 7/2000 | Nguyen | 726/27 |
| 6,336,202 | B1 * | 1/2002 | Tsuchimoto et al. | 714/768 |
| 6,449,111 | B1 * | 9/2002 | Kool et al. | 360/48 |
| 7,224,650 | B2 * | 5/2007 | Hino et al. | 369/47.14 |

OTHER PUBLICATIONS

NN83024699, Processor System Architecture for Accommodating Disk Storage Units Having Different Sector Sizes, IBM Technical Disclosure Bulletin, Feb. 1983,vol. No. 25 Issue No. 9.*

* cited by examiner

*Primary Examiner*—Joseph D Torres
(74) *Attorney, Agent, or Firm*—McAndrews, Held & Malloy, Ltd.

(57) ABSTRACT

Herein described is at least a method and system for processing a read or write operation when one or more defects are mapped using one or more fractional sectors. The method comprises using one or more fractional sectors to map defects and to store data symbols. Furthermore, a first algorithm is used for translating a logical block address into a physical starting location such that one or more fractional sectors may be processed during a read or write operation. A second algorithm is used for temporally processing one or more portions of a track of a disk drive, wherein the one or more portions may comprise one or more defective fractional sectors, non-defective fractional sectors, frame remainders, and servo sectors. The system comprises a memory, a processor, and software resident in said memory. The process executes the software that implements the first and second algorithms.

36 Claims, 7 Drawing Sheets

USING FRACTIONAL SECTORS FOR MAPPING DEFECTS IN DISK DRIVES

RELATED APPLICATIONS/INCORPORATION BY REFERENCE

[Not Applicable]

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

As computer applications become more powerful and as the number of applications used by a computing device increase, the data storage requirements of the computing device increases correspondingly. Given the limited amount of space provided by a hard disk drive, there are unfortunately a number of physical limitations to the amount of data storage that may be contained in the hard disk drive. For example, the number of symbols that may be coded within a track of a magnetic disk drive is limited using a particular disk drive media. For small form factor disk drives, such as notebook drives, storage capacity is at a premium. As a consequence, a disk drive manufacturer may wish to develop ways to improve storage capacity provided by a hard disk drive.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Various aspects of the invention provide an improvement in storage space within a disk drive when defects, such as primary defects, are mapped using one or more fractional sectors. The various aspects are substantially as shown in and/or described in connection with at least one of the following figures, as set forth more completely in the claims.

These and other advantages, aspects, and novel features of the present invention, as well as details of illustrated embodiments thereof, will be more fully understood from the following description and drawings.

DETAILED DESCRIPTION OF THE INVENTION

Aspects of the present invention may be found in a system and method of improving storage capacity of a disk drive. Aspects of the invention allow a disk drive to be mapped using one or more fractional sectors of one or more tracks of a disk drive. Defects present in the disk drive may be mapped using the one or more fractional sectors. The mapping may be performed by way of a defect table, for example. In a representative embodiment, the defect table comprises one or more entries that specify the good and bad fractional sectors of one or more tracks of a disk drive. The good (non-defective or usable) and bad (defective or unusable) fractional sectors may be located or tracked by using one or more good or bad "counts", as will be described later. The defect table may be implemented using any type of memory. A defective data span is mapped such that it is prevented from being used for data storage when a read or write is performed. By using such fractional sectors instead of whole sectors to map defects, the available storage capacity provided by the disk drive is increased by using a higher percentage of the disk drive storage media. In a representative embodiment, the fractional sector size is selected or determined based on an expected defect size. In a representative embodiment, the disk drive comprises a magnetic hard disk drive. In a representative embodiment, the defect comprises a primary defect. Further aspects of the invention provide a method and system of mapping the location of the one or more fractional sectors within a track using the defect table. The good and bad fractional sectors are tracked or accounted for by way of using one or more algorithms. In a representative embodiment, the tracking (or accounting) is performed by translating a starting logical block address (LBA) into a starting fractional sector; subsequently one or more good and bad fractional sectors are mapped using a table of entries, and processed sequentially. The one or more algorithms facilitate performing a read or a write operation using the one or more fractional sectors. The one or more algorithms provide tracking of good and bad fractional sectors by using the good and bad counts, respectively. The one or more algorithms facilitate the tracking of defects or bad fractional sectors, good fractional data sectors, servo sectors, and frame remainders, for example.

Figure 1:
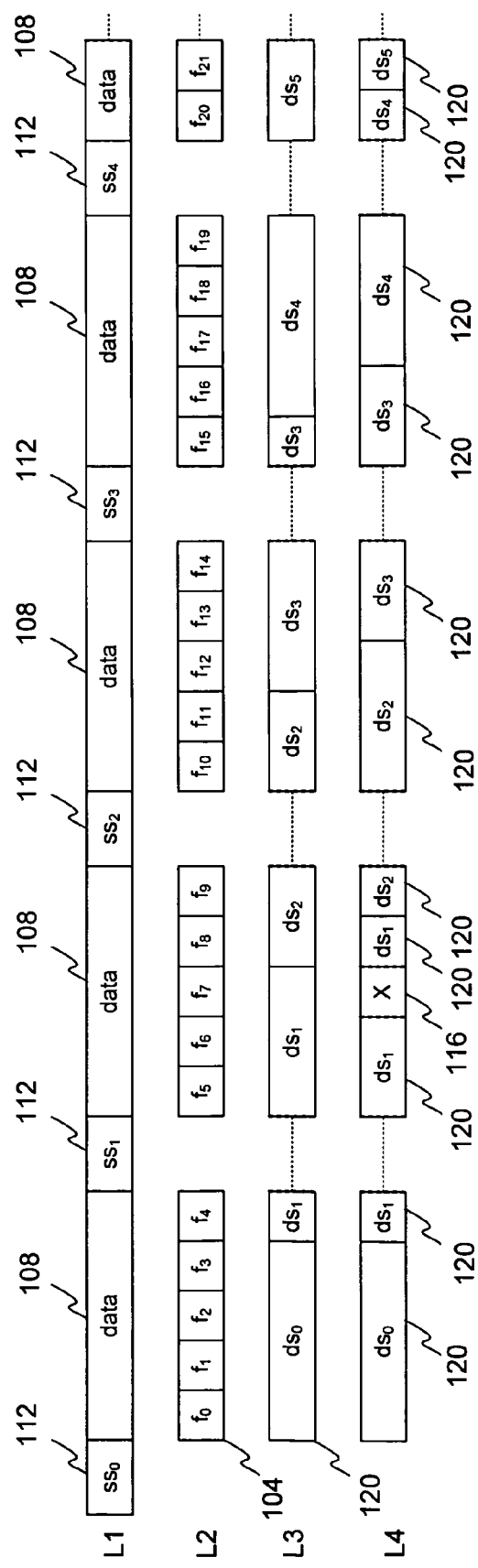
FIG. 1 is a relational block diagram illustrating one or more fractional sectors used for storing one or more spans of data symbols and for mapping one or more defects, in accordance with an embodiment of the invention.

FIG. 1 is a relational block diagram illustrating one or more fractional sectors 104 used for storing one or more spans of data symbols and for mapping one or more defects, in accordance with an embodiment of the invention. FIG. 1 comprises four subdiagrams, referred to as lines L1, L2, L3, and L4, that illustrate portions of a track in a disk drive that are processed when the track is accessed by a magnetic read/write head, for example. The track is processed temporally from left to right for each subdiagram illustrated. Each line provides a temporal representation of the sequence of sectors or fractional sectors encountered as may occur when reading or writing one or more fractional sectors in a track of a disk drive. In accordance with various aspects of the invention, the sequence of servo sectors 112 and fractional sectors 104 identified as, $ss_0$, $f_0$, $f_1$, $f_2$, $f_3$, $f_4$, $ss_1$, $f_5$, $f_6$, $f_7$, $f_8$, $f_9$, $ss_2$, $f_{10}$, $f_{11}$, $f_{12}$, $f_{13}$, $f_{14}$, $ss_3$, $f_{15}$, $f_{16}$, $f_{17}$, $f_{18}$, $f_{19}$, comprises what is known as a split frame. A split frame comprises a repeating pattern of split data sectors 120. As illustrated in FIG. 1, each of the one or more servo sectors 112 may split each of the one or more data sectors 120. The subdiagrams illustrate processing of a split frame when one or more data sectors 120 are divided into one or more fractional sectors 104. With respect to line L1, a number of data symbols 108 are stored on a track such that the data symbols 108 are separated using servo sectors (i.e., $ss_0$, $ss_1$, $ss_2$, $ss_3$, $ss_4$) 112. With respect to line L2, an exemplary five fractional sectors 104 are used to store the data symbols 108 represented in line L1. Line L2 illustrates the use of dividing the one or more sectors 120 into one or more fractional sectors (i.e., $f_0$, $f_1$, $f_2$, $f_3$, $f_4$) 104, of which the one or more fractional sectors are located between servo sectors (i.e., $ss_0$ and $ss_1$)) 112. Each of the fractional sectors 104, as illustrated, is equivalent in size. Line L3 illustrates how four fractional sectors 104 may be used to represent a single data sector 120, in accordance with an embodiment of the invention. For example, referring to Line L3, data sector $ds_o$ 120 comprises four fractional sectors labeled $f_0$, $f_1$, $f_2$, and $f_3$ 104. The servo sector, $ss_1$, 112 is encountered after fractional sector, $f_4$ 104. The servo sector, $ss_1$, 112 splits data sector $ds_1$ 120 after 25% of $ds_1$ 120 is processed. Line L4 illustrates processing of an exemplary defect 116 that occupies a fractional sector 104 within data sector $ds_1$ 120. The defect 116 occurs after 75% of $ds_1$ is processed or 3 of 4 fractional sectors of $ds_1$, are processed. As a consequence, the data sectors 120 that follow $ds_1$ 120 are slid by a single fractional sector 104 (i.e., encountered one quarter of a data sector thereafter). In a representative embodiment, the size of the fractional sector 104 is selected or configured to correspond to the size of the defect 116. In summary, the representative embodiment of FIG. 1 illustrates that a defect 116, such as a primary defect, in a disk drive, should be disregarded or skipped over when the disk drive performs a read or write operation. It is contemplated that the number of fractional sectors 104 used to divide a sector 120 may be determined based on the typical space (or portion of a sector 120) a defect 116 occupies. In comparison with using whole sectors 120 for isolating or mapping one or more defects, various aspects of the present invention allow mapping of the one or more defects 116 using fractional sectors 104. When defects are mapped using whole sectors, the portion of the sector 120 that contains a defect may comprise only a small fraction of the whole sector 120. Consequently, a sizeable portion of the sector 120, that is not used to map the defect, comprises storage space that is unable to be used to store data symbols. Hence, by way of using fractional sectors 104, in accordance with various aspects of the invention, the storage capacity of a disk drive is improved by reducing such wasted storage space. In a representative embodiment, the size of a sector 120 is 4096 bytes while the size of a fractional sector 104 is 256 bytes. In the representative embodiment, the fractional sector 104 size of 256 bytes is chosen because it corresponds to a typically encountered defect 116 size within a disk drive. As will be discussed later, one or more algorithms are used to properly process the one or more fractional sectors 104 and servo sectors 112 encountered during a read or write operation.

By way of using one or more algorithms to process fractional sectors of a track in a disk drive, various aspects of the invention allow fractional data sector starting locations to easily slide or skip through one or more spans of data symbols. The one or more spans of data symbols may comprise one or more defective fractional sectors. For example, processing of encountered defects may occur by skipping over (or sliding over) one or more fractional sectors that contain the defects, and the sliding may occur across track and zone boundaries. Groups of tracks associated with a particular head in a disk drive may be treated as a related set. This related set may be referred to as a zone.

Various aspects of the invention may employ address (LBA) translation that utilizes a data structure configured as a table such that each element in the table provides entries that specify a good count and a defective count. In a representative embodiment, each entry may comprise a good count value and defective count value. This pair of values indicates the number of consecutive good counts followed by the number of consecutive bad counts. The first pair of values may correspond to consecutive non-defective fractional sectors and consecutive defective fractional sectors that are encountered immediately after a servo sector, for example. The table may be implemented using any type of memory device. An aspect of the invention involves modifying the count unit from that of a whole sector to that of a fractional sector. Although not described, other appropriate data structures may be used to perform such an address translation. In a representative embodiment, a track may not provide an integral number of data sectors. As a consequence, a disk drive may truncate the storage of each track to an integral number of data sectors or allow data sectors to be split across two tracks. Splits across zone boundaries may not be allowed because the data frequency would need to be altered. In a representative embodiment, the various aspects of the invention allow sectors to be split across tracks, thereby increasing disk drive storage capacity. Using a fractional sector primary defect system provides for increased data frequency choices per zone and increased total data storage.

Fractional-sector primary defects may appear in the middle of data sectors, as illustrated in FIG. 1. Data sectors with intervening primary defects may use a prefix field at the end of each defective symbol span, and a disk controller of its disk drive facilitates pausing (or skipping of the defective symbol span) across the defective symbols during reading or writing. During a read or write operation, the disk controller may pause when a servo sector is encountered. Furthermore, a prefix field may be used after each servo sector. The prefix field may be in a location outside of the possible data storage symbol region between a pair of servo sectors. Ease of address translation and the improvement in storage capacity when fractional sectors are used for mapping primary defects more than compensates for the small storage capacity reduction when using such prefix fields.

A frame may contain a fixed number of fractional sectors, followed by a number of remainder symbols that may be zero valued. For disk drive systems in which the size of data sectors is larger and/or the number of symbols between servo sectors is greater, whole-sector primary defects create difficulties and inefficiencies. In this instance, the set of desirable data frequencies is much smaller, which may result in larger split frame sizes at greater random access memory (RAM) costs. Fractional-sector primary defects improve on one or more of these issues. If whole sector primary defects are still desirable, the various aspects of the invention may be adapted by setting the primary defects per sector ratio to 1:1. Any grown defect sector mapping is assumed to precede primary defect address translation. In a representative embodiment, the number of servo sectors per track, the symbols per sector, and the symbols per fraction are fixed throughout the drive. A zone may be mapped by way of using zone table entries. Zone table entries may be stored in memory, such as a dynamic random access memory (DRAM), for example. A zone table entry may define a zone beginning logical block address (LBA), a pointer into a primary defect table, a flag determining whether the zone begins with a defective fraction or not, the number of data symbols between servo sectors (not including the post-servo-sector prefix field), and the number of fractional sectors per split frame.

Various aspects of the invention utilize an algorithm for translating the first LBA of a read/write sector span into a physical starting track, servo sector, and offset in the data symbol region. The first LBA may be mapped to a location on a track after its corresponding servo sector. The algorithm may be described and implemented by way of the following steps and/or equations, which may be coded into a software program or computer readable code:

1. Search the zone table to find the zone containing the requested LBA
2. Logical fraction of zone (LFOZ)=
   (LBA−zone beginning LBA)*symbols per sector/symbols per fraction
3. Entry for the beginning of the zone=Primary defect table entry
4. If the zone begins with defects then:
   Cumulative bad count (CUMBAD)=entry bad count
   Good count for entry (GOOD)=0
   Cumulative good count (CUMGOOD)=0
5. Else:
   CUMBAD=0
   GOOD=min(entry good count, LFOZ)
   CUMGOOD=GOOD
6. While CUMGOOD<LFOZ loop:
   Entry=successive primary defect table entry
   If (CUMGOOD+entry good count)<LFOZ
   CUMBAD=CUMBAD+entry bad count
   GOOD=entry good count
   Else
   GOOD=LFOZ−CUMGOOD
   CUMGOOD=CUMGOOD+GOOD
7. Frames before start (FBS)=(CUMGOOD+CUMBAD)/fractions per frame
8. Starting symbol within frame (SOF)=
   rem((CUMGOOD+CUMBAD), fractions per frame)*symbols per fraction
9. Frame remainder slippage (REMSLIP)=FBS*symbols per frame remainder
10. Physical symbol of zone (PSOZ)=
    (CUMGOOD+CUMBAD)*symbols per fraction+ REMSLIP
11. Servo sector of zone (VOZ)=PSOZ/symbols between servo sectors
12. Starting symbol within servo sector (SOV)=rem(PSOZ, symbols between servo sectors)
13. Starting track of zone (TOZ)=VOZ/servo sectors per track
14. Servo sector # within the track (VOT)=rem(VOZ, servo sectors per track)

Figure 2A:
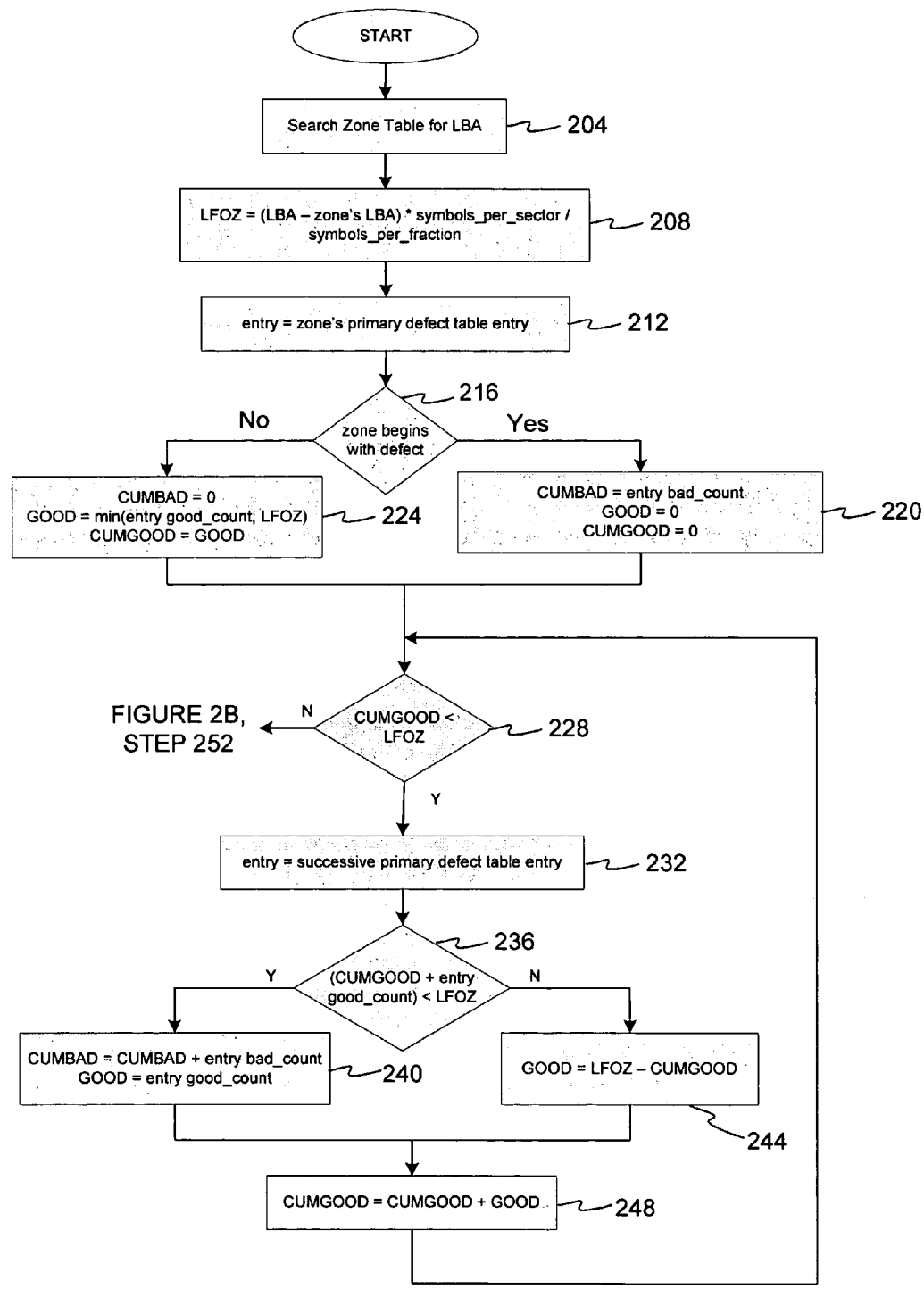
FIGS. 2A and 2B are operational flow diagrams providing a first algorithm for translating a logical block address (LBA) of a read/write data sector into a physical starting point on a disk drive media, in accordance with an embodiment of the invention.
Figure 2B:
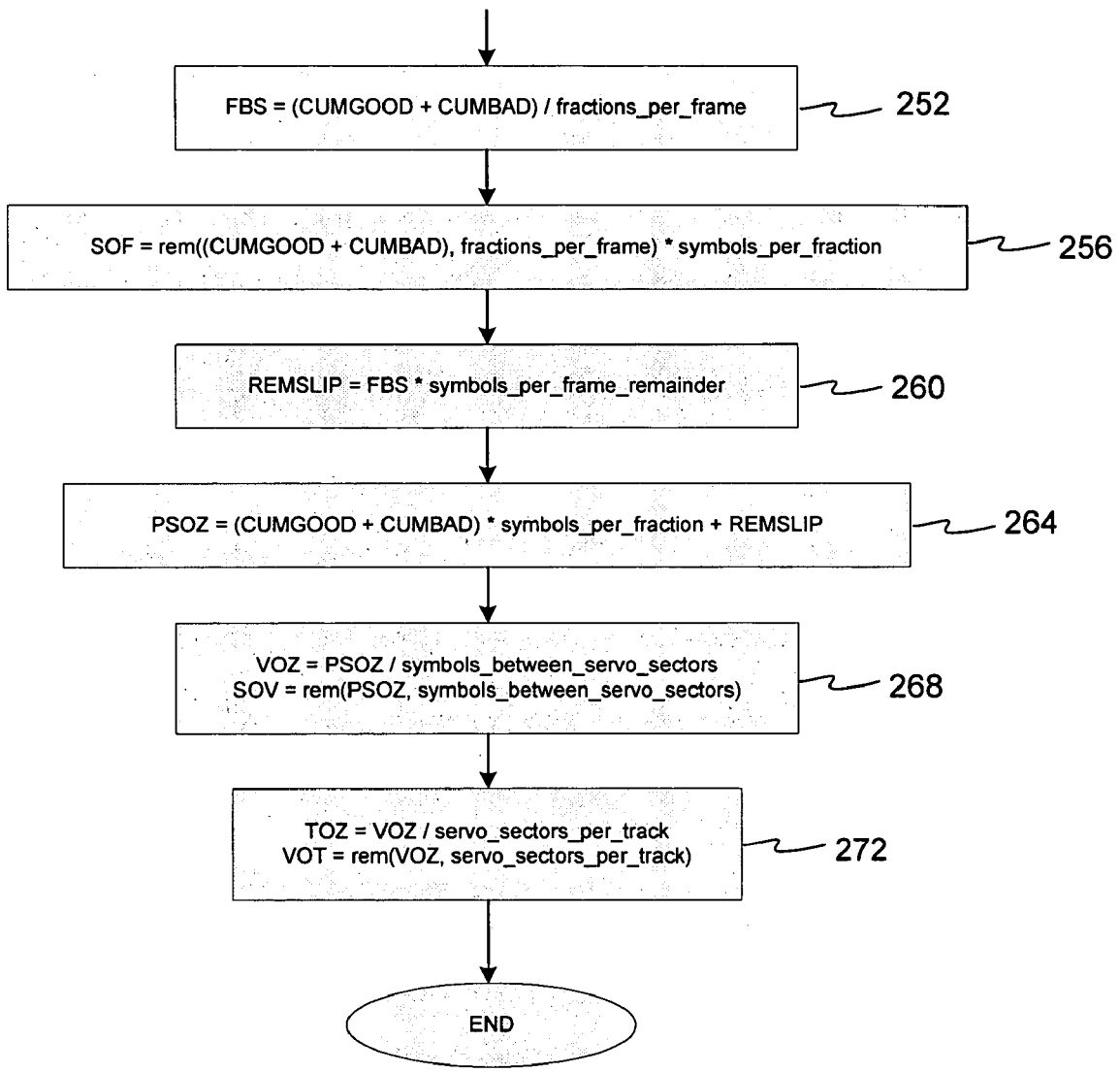

FIGS. 2A and 2B are operational flow diagrams providing a first algorithm for translating a logical block address (LBA) of a read/write data sector into a physical starting point on a disk drive media, in accordance with an embodiment of the invention. In a representative embodiment, the physical starting point on the hard disk media comprises a starting track, a servo sector, and an offset. The physical starting point marks the beginning of a data symbol region of a disk drive. The physical starting track comprises cylinder and head information. The beginning of the data symbol region commences after its corresponding servo sector. This may be easily visualized with reference to FIG. 1. At step 204, a zone table may be searched within memory of the disk drive. The groups of tracks associated with a particular head in a disk drive may be treated as a related set, which may be termed or referred to as a zone. Data sectors within a zone may be stored with the same data frequency such that there are a particular number of symbols between servo sectors. The size of the fraction is implementation dependent, described in units of symbols. At step 208, the logical fraction of the zone (LFOZ) is determined at which the beginning of the data symbol region commences. The LFOZ is computed using the following equation:

(LFOZ)=(LBA−zone beginning LBA)*(symbols_per_sector/symbols_per_fraction)

The first factor is determined by subtracting the zone beginning LBA from the LBA. The second factor provides the number of fractions in a sector. The terms symbols_per_sector and symbols_per_fraction are constants. Next, at step 212, a variable, referred to as entry (corresponding to the beginning of the zone) is set equal to "the primary defect table entry". The primary defect table entry may be found in memory used by the disk drive. At step 216, the method determines whether or not the zone begins with a defect. If the zone begins with a defect, then at step 220, the variable that tallies the cumulative bad count (CUMBAD) is set equal to entry_bad_count. The entry_bad_count value or number of defective fractional sectors is obtained from a primary defect table entry stored in memory. The variable that initializes the good count (GOOD) is set to zero, and the variable that tallies the cumulative good count (CUMGOOD) is set to zero. Otherwise, if the zone does not start with a usable fractional sector, at step 224, CUMBAD is set equal to zero, GOOD is set equal to the minimum of either entry_good_count (an entry in the primary defect table that specifies the good count) or the LFOZ, and CUMGOOD is set equal to GOOD. The process further proceeds at step 228, at which it is determined whether CUMGOOD is less than LFOZ. If CUMGOOD is less than LFOZ, then the process proceeds with step 232. Otherwise, the process proceeds with FIG. 2B, step 252, as will be described later. At step 232, entry is set equal to the next successive primary defect table entry. Then at step 236, it is determined whether the sum of CUMGOOD and entry_good_count is less than LFOZ. If the sum is less than LFOZ, then the process proceeds to step 240, at which, CUMBAD is set equal to CUMBAD plus entry_bad_count, and GOOD is set equal to entry_good_count. Otherwise, the process proceeds with step 244, at which GOOD is set equal to the difference between LFOZ and CUMGOOD. Thereafter, CUMGOOD is incremented by GOOD at step 248. Thereafter, the process reverts to step 228. Referring to FIG. 2B, if at step 228 CUMGOOD is not less than LFOZ, the process continues with step 252. At this step, one or more frames, such as split frames, are accounted for prior to the starting point. The split frames may comprise a number of split fractions, in accordance with the various aspects of the invention. The number of frames (e.g., split frames) before start (FBS) is computed by way of the following equation:

Frames before start (FBS)=(CUMGOOD+CUMBAD)/fractions_per_frame

The sum, (CUMGOOD+CUMBAD), provides the number of cumulative good and cumulative bad fractions encountered in a zone before encountering the start of the LBA for the first data symbol. The term, fractions_per_frame, is a constant and provides a value of the number of fractional sectors per frame. Next, at step 256, the Starting Symbol within a Frame (SOF) or offset is determined using the following equation:

Starting symbol within frame (SOF)=*rem*((CUMGOOD+CUMBAD), fractions_per_frame)*symbols per fraction The rem operator computes the remainder after a division is performed between the divided, (CUMGOOD+CUMBAD), and the divisor, (fractions_per_frame). This computation provides the starting point or offset in terms of symbols. Thereafter, at step 260, the cumulative slippage or cumulative frame remainder offset (REMSLIP) associated with all frame remainders previously encountered (prior to the physical starting point) is determined by way of the following equation:

Frame remainder slippage (REMSLIP)
=FBS*symbols_per_frame_remainder

The term, symbols_per_frame_remainder, is a constant and provides a value of the number of symbols per frame remainder. This is followed by step 264, at which, the physical location of the first data symbol of the zone (PSOZ) is computed, using the following equation:

Physical symbol of zone (PSOZ)=(CUMGOOD+
CUMBAD)*symbols_per_fraction+REMSLIP

As provided by the last equation, the first symbol of the first fraction associated with the LBA of the data span is computed here. PSOZ is computed by summing the good and bad fractions, and subsequently multiplying this with the number of symbols per fraction. The term, symbols_per_fraction, is a constant and provides a value of the number of symbols per fractional sector. The product is then added to REMSLIP to obtain the starting point using the number of physical symbols in the zone. Next, at step 268, the associated Servo Sector of the Zone (VOZ) and the Starting Symbol between Servo Sectors (SOV) are computed using the following equations:

(VOZ)=PSOZ/symbols_between_servo_sectors (SOV)=rem(PSOZ, symbols_between_servo_sectors)

As may be seen, the associated servo sector is computed by dividing the number of physical symbols in the zone by the symbols in a servo sector. The starting symbol between servo sectors is determined by taking the remainder after PSOZ is divided by the number of symbols in a servo sector. It is contemplated that the number of symbols between servo sectors, symbols_between_servo_sectors, comprises a fixed number or constant. Thereafter, at step 272, the Starting Track of the Zone (TOZ) as well as the Starting Servo Sector of the associated Track (VOT) are computed using the following equations:

Starting track of zone (TOZ)=VOZ/servo_sectors_per-
_track Servo sector # within the track (VOT)
=rem(VOZ, servo_sectors_per_track)

TOZ is found by dividing VOZ (servo sector number associated with the physical starting point) by the number of servo sectors in a track, servo_sectors_per_track. In a representative embodiment, the value of servo_sectors_per_track comprises a fixed number or constant. VOT indexes the starting servo sector in its corresponding track, and is determined by taking the remainder after VOZ is divided by the number of servo sectors in a track. The process ends at step 272. One or more of the previous computations may be used in computing one or more values in the algorithm described in FIGS. 3A, 3B, and 3C.

Various aspects of the invention provide for an algorithm for tracking fractional sectors when a read or write operation is performed. The fractional sectors may comprise defective or non-defective fractional sectors. When performing a read or write operation, the algorithm accounts for primary defects, frame remainders, and split frames, for example. The algorithm may be implemented by way of the following steps and equations, which may be coded into a software program or a computer readable code:

1. Needed symbols (NEEDS)=requested sector count*symbols_per_sector
2. GOOD=min(entry good count*symbols_per_fraction–GOOD, NEEDS)
3. While NEEDS>0 loop:
While NEEDS>0 and GOOD>0 loop:
Symbols remaining in sector (SRS)=symbols_per_sector
While SRS>0 and GOOD>0 and NEEDS>0 loop:
If (((SOV+SRS)<symbols_between_servo_sectors) and
((SOF+SRS)<
(fractions_per_frame*symbols_per_fraction)))
then
/*sector ends before servo sector and end of frame is reached*/
SOV=SOV+SRS
SOF=SOF+SRS
GOOD=GOOD–SRS
NEEDS=NEEDS–SRS
Output SRS as a good count
SRS=0
Else
/*good splits*/
SPLIT=symbols_between_servo_sectors–SOV
SOV=0
If (SOF+SPLIT)>=(fractions_per_frame*
symbols_per_fraction) then
/*frame remainder just before split*/
SOF=0
SPLIT=SPLIT–symbols_per_frame_remainder
Else
SOF=SOF+SPLIT
GOOD=GOOD–SPLIT
NEEDS=NEEDS–SPLIT
SRS=SRS–SPLIT
VOT=VOT+1
If VOT=servo_sectors_per_track then
Output SPLIT as a good-then-split-across-tracks count
Else
Output SPLIT as a good-then-split count
VOT=rem(VOT, servo_13_sectors_per_track)
If NEEDS>0 then
Defective symbols for entry (BAD)=entry_bad_count*
symbols_per_defect
While BAD>0 loop:
If (((SOV+BAD)<symbols_between_servo_sectors) and
((SOF+BAD)<(fractions_per_frame*
symbols_per_fraction))) then
/*defect ends before servo sector and end of frame is reached*/
SOV=SOV+BAD
Output BAD as a bad count
BAD=0
Else
/*defect splits*/
SPLIT=symbols_between_servo_sectors–SOV
SOV=0
If (SOF+SPLIT)>(fractions_per_frame*
symbols_per_fraction) then
/*frame remainder before split*/
SOF=0
SPLIT=SPLIT–symbols_per_frame_remainder
Else
SOF=SOF+SPLIT
BAD=BAD–SPLIT
VOT=VOT+1
If VOT=servo_sectors_per_track then Output SPLIT as a bad-then-split-across-tracks count
    Else
        Output SPLIT as a bad-then-split count
        VOT=rem(VOT, servo_sectors_per_track)
    Entry=successive primary defect table entry
    GOOD=min(entry good count*symbols_per_defect, NEEDS)

Figure 3A:
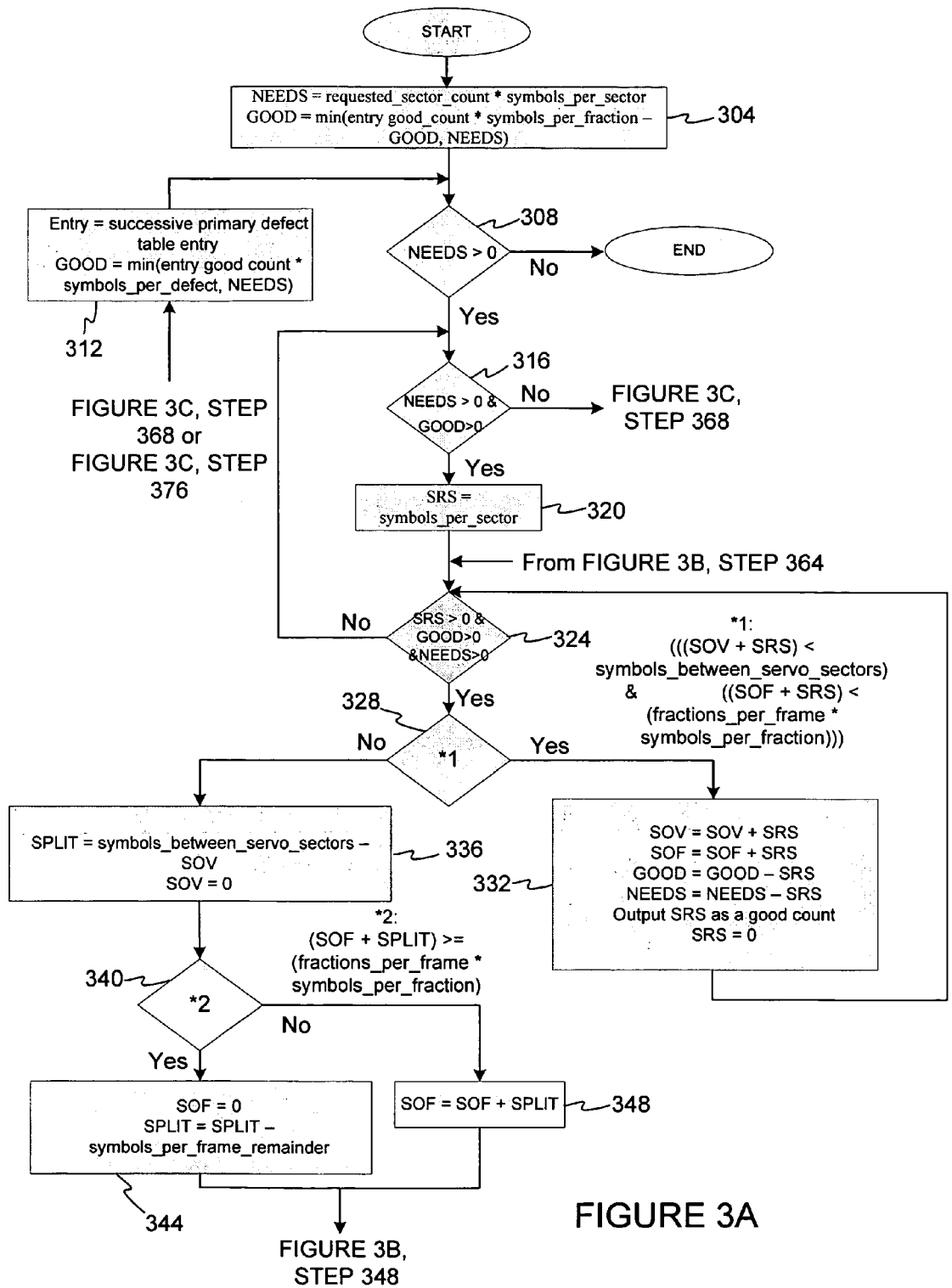
FIGS. 3A, 3B, and 3C are operational flow diagrams providing a second algorithm for reading from and writing data into a number of fractional sectors of a track of a disk drive, in accordance with an embodiment of the invention.
Figure 3B:
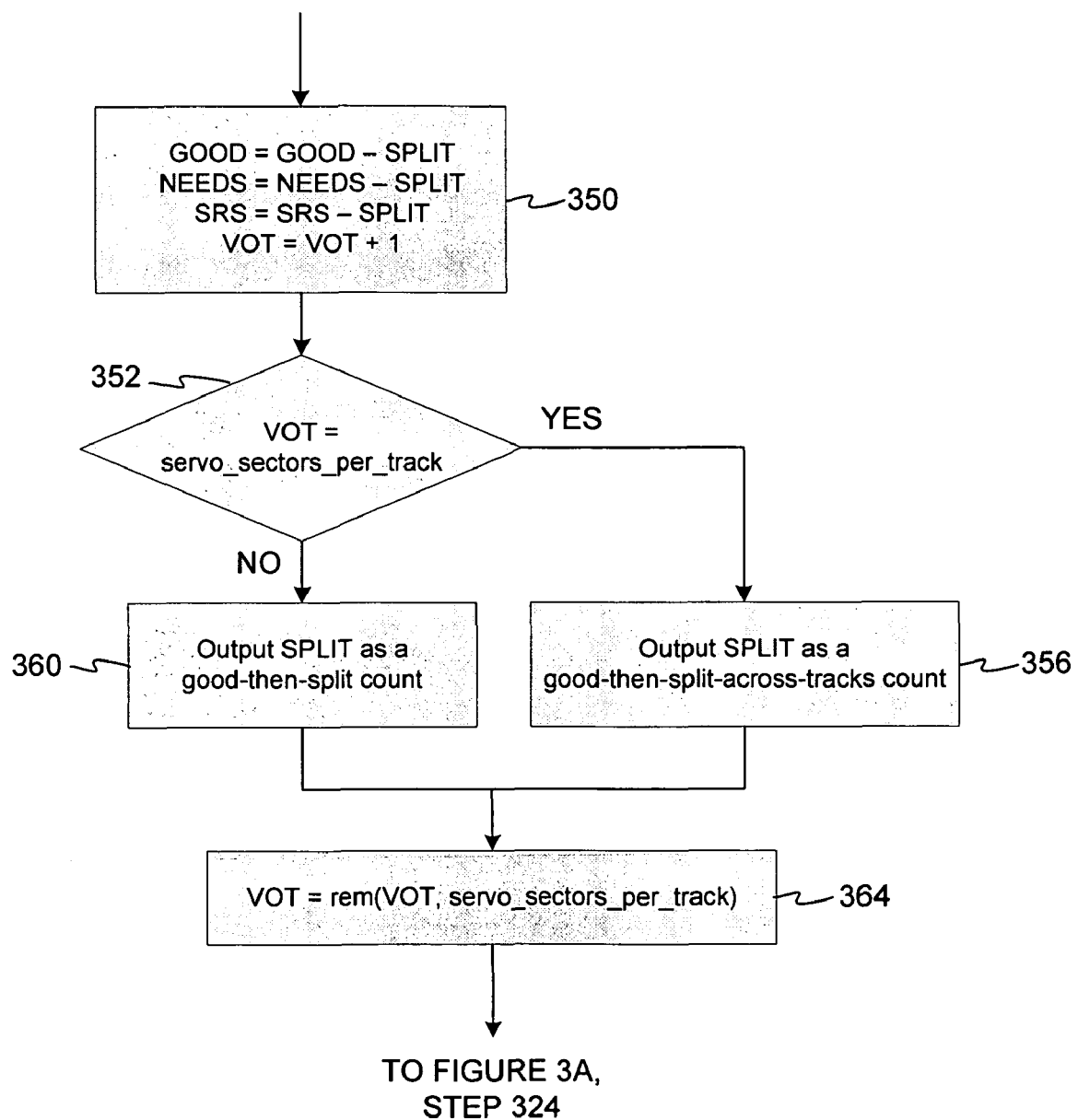
Figure 3C:
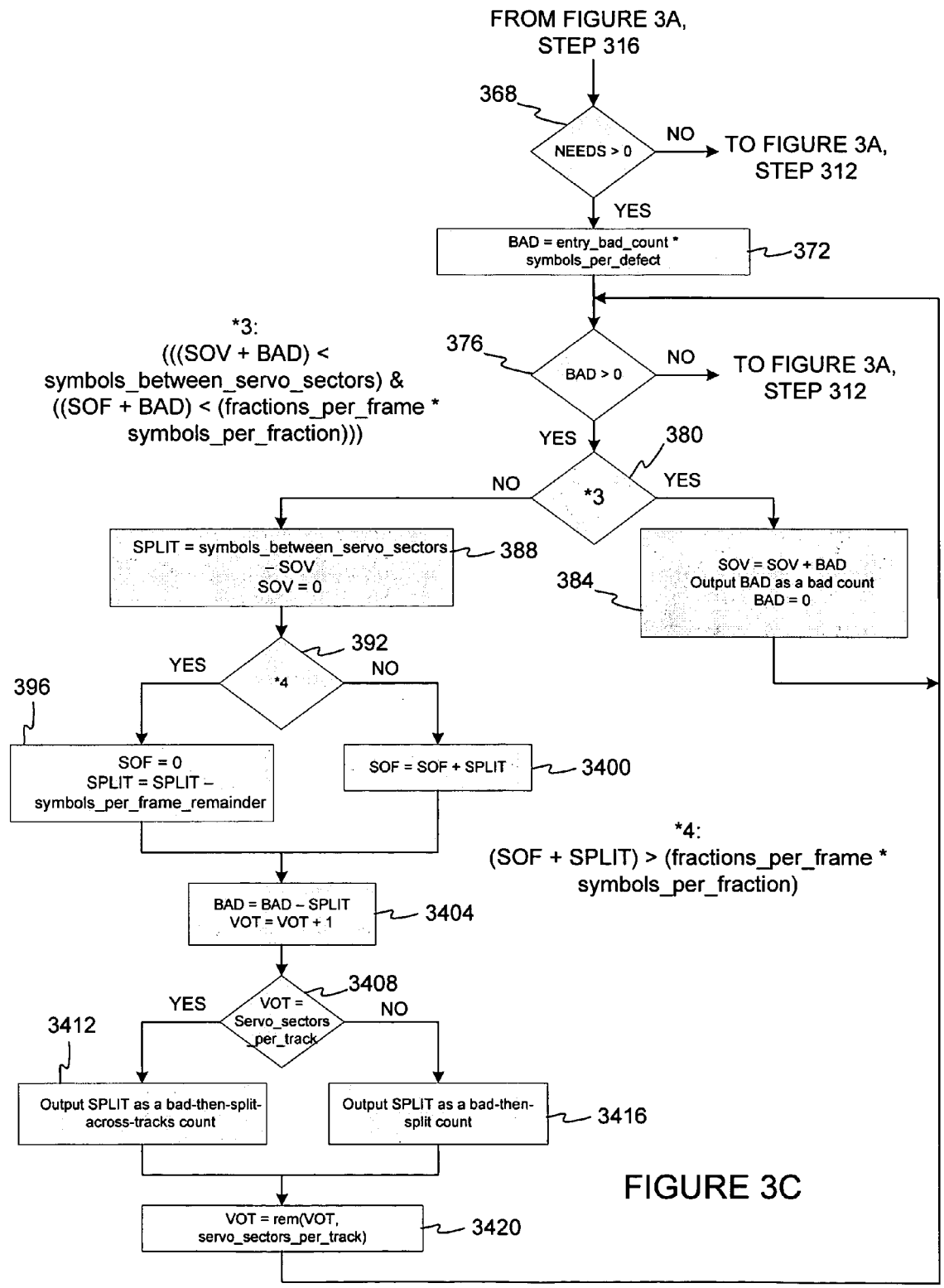

FIGS. 3A, 3B, and 3C are operational flow diagrams providing a second algorithm for reading from and writing data into a number of fractional sectors of one or more tracks of a disk drive, in accordance with an embodiment of the invention. The first algorithm presented by FIGS. 2A and 2B determines or maps the starting track, servo sector, and offset of the first data symbol corresponding to the first LBA of a read/write sector span, while the second algorithm presented by FIGS. 3A, 3B, and 3C determines the symbol counts for a requested read/write sector span. The amount of available storage capacity of physical media in a disk drive may be tracked or accounted for by way of using bad and good counts. The good count may be used as a measuring unit to track storage capacity provided by non-defective fractional sectors. The bad count may be used to measure the defective fractional sectors. The algorithm described by FIGS. 3A, 3B, and 3C utilizes one or more values provided by the algorithm described by FIGS. 2A and 2B.

Referring to FIG. 3A, at step 304, the number of data symbols requested in a read or write is computed and stored using the variable NEEDS. The number of good symbols required for the read or write operation is computed using the following equation where the variable, entry good count, refers to the last primary defect table entry encountered in the algorithm provided by FIGS. 2A and 2B:

GOOD=*min*(entry good count*symbols_per_fraction−GOOD, NEEDS)

This computation is performed by choosing the minimum of either (entry good count*symbols_per_fraction−GOOD) or NEEDS. The entry good count may be determined from a table of values implemented, for example, in a memory. In this representative embodiment, the entry good count is provided in terms of number of good or usable (non-defective) fractional sectors. Next, at step 308, a decision is made based on the value of NEEDS. If NEEDS is greater than the value zero, the process continues with step 316. Otherwise, the process ends, since an outstanding request for one or more good symbols is absent. At step 316, it is determined if NEEDS and GOOD are both greater than zero. If NEEDS and GOOD are both greater than zero, then the process proceeds at step 320, at which, the variable, Symbols Remaining in Sector (SRS), is set equal to the number of symbols in a sector, symbols_per_sector. Next, at step 324, it is determined whether NEEDS and GOOD and SRS are all greater than zero. If whether NEEDS and GOOD and SRS are all greater than zero, the process proceeds with step 328. Otherwise, the process reverts back to step 316, at which, it is again determined whether NEEDS and GOOD are both greater than zero. At step 328, a decision is made to proceed to step 332 if the following logical statement is true:

(((SOV+SRS)<symbols_between_servo_sectors) and
    ((SOF+SRS)<
(fractions_per_frame*symbols_per_fraction)))

When the previous logical statement is true, the sector ends before encountering the next servo sector and the end of the current frame has been reached. Next, at step 332, SOV and SOF are incremented by SRS, while GOOD and NEEDS are decremented by SRS. SOV and SOF, after being incremented by SRS, provide the next starting symbol positions or locations after the current sector has been processed. Thereafter, SRS is output as a symbol count for performing the read or write operation. The symbol count output may be used by a disk interface for controlling the read or write operation. The disk interface may comprise any type hardware for facilitating a read or write operation. The disk interface may be communicatively coupled to a magnetic read/write head, for example. Thereafter, SRS is set equal to the value zero. The second algorithm outputs the number of data symbol counts (i.e., corresponding to physical locations on a disk drive media of a disk drive) that will be used for performing a write or read operation, for example. Otherwise, if the logical statement of step 328 is untrue, the process proceeds with step 336. At step 336, the variable SPLIT is computed by subtracting SOV from the number of symbols between adjacent servo sectors. Thereafter, SOV is reset to zero since the process has accounted for the one or more symbols up to the next servo sector. Next, at step 340, the sum of SOF and SPLIT and the product of the number of fractions per frame and the number of symbols per fraction are computed. If the sum is greater than or equal to the product, then the process proceeds with step 344. At step 344, SOF (i.e., the frame offset) is reset to zero while SPLIT is decremented by the number of symbols per frame remainder. Otherwise, the process continues with step 348, at which the frame offset (SOF) is incremented by SPLIT. Next, at step 350, GOOD, NEEDS, and SRS are decremented by the value of SPLIT, while the starting servo sector of the current track (VOT) is incremented by one. Subsequently, at step 352, the starting servo sector in the current track (VOT) is compared to the number of servo sectors per track, servo_sectors_per_track. If VOT is equal to the number of servo sectors per track, then the process continues with step 356, at which the value of SPLIT is output as a good-then-split-across-tracks count. Otherwise, at step 360, the value of SPLIT is output as a good-then-split count. Thereafter, the starting servo sector is determined at step 364 by computing the remainder after dividing VOT by the number of servo sectors per track. The process then reverts back to step 324. If at step 316, NEEDS and GOOD are not both greater than zero, the process jumps to step 368 shown in FIG. 3C, at which point the bad fractional sectors are evaluated. At step 368, if the value of NEEDS is greater than zero, then the process proceeds to step 372. Otherwise, the process reverts to step 312 shown in FIG. 3A, at which entry is set equal to the next successive primary defect table entry and GOOD is set equal to the minimum of either the product of entry good count and the number of symbols per defect or the value provided by NEEDS. The process continues at step 308. At step 372, the number of defective symbols (BAD) is computed by computing the product of the bad count in the primary defect table and the number of symbols per defective fractional sector. Next, at step 376, it is determined whether BAD is greater than zero. If BAD is greater than zero, the process continues along with step 380. Otherwise, the process reverts back to step 312. At step 380, a decision is made by evaluating the following statement:

(((SOV+BAD)<symbols between servo sectors) and
    ((SOF+BAD)<(fractions per frame*symbols per fraction)))

If the preceding statement is true, the process proceeds with step 384. Otherwise, the process proceeds with step 388. At step 384, the starting symbol between servo sectors (SOV) is incremented by BAD and BAD is output as a bad count. Thereafter, BAD is reset to zero and the process reverts back to step 312. At step 388, SPLIT is computed by subtracting SOV from the number of symbols between servo sectors.

Thereafter, SOV is reset to zero. Next, at step 392, it is determined whether the following statement holds true:

(SOF+SPLIT)>
(fractions_per_frame*symbols_per_fraction)

If the preceding statement holds true, then a frame remainder exists in the frame and the process continues with step 396, at which, the starting symbol within the frame (SOF) is reset to zero. Also, SPLIT is decremented by the number of symbols per frame remainder, symbols_per_frame_remainder. If the preceding statement does not hold true, then the process continues with step 3400, at which SOF is incremented by SPLIT. Next, at step 3404, the process continues as BAD is decremented by SPLIT and VOT is incremented by one. This is followed by step 3408, at which the servo sector number of the track (VOT) is compared to the number of servo sectors per track, servo_sectors_per_track. If VOT is equal to the number of servo sectors per track, the end of the track has been reached, and as a consequence the next track needs to be read at step 3412. At step 3412, the value of SPLIT is output as a bad-then-split-across-tracks count (i.e., this specifies that the number of bad symbols is output and that the bad count continues into the next track). Otherwise, at step 3416, the value of SPLIT is output as a bad-then-split count, signifying that the servo sector splits the bad sector in the current track. Thereafter, the process continues with step 3420, at which, the starting servo sector of the track is determined by computing the remainder after dividing VOT by the number of servo sectors per track. The process then reverts back to step 376.

Figure 4:
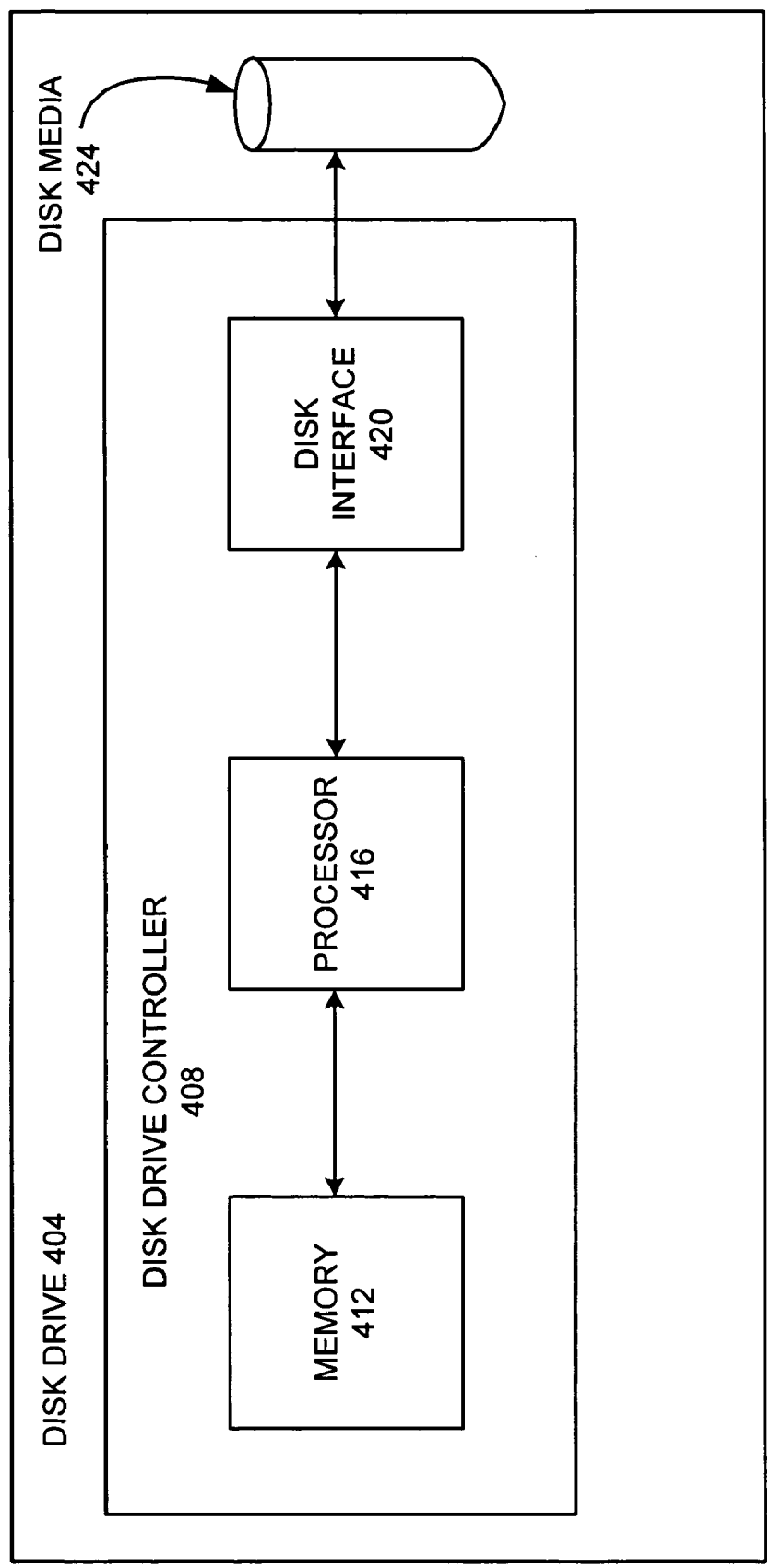
FIG. 4 is a block diagram illustrating a system that maps defects and stores data symbols into fractional sectors, in accordance with an embodiment of the invention.

FIG. 4 is a block diagram illustrating a system that maps defects and stores data symbols into fractional sectors, in accordance with an embodiment of the invention. The system comprises a memory 412, a processor 416, a disk interface 420, and a disk media 424 residing within a disk drive 404. The memory 412, processor 416, and disk interface 420 may reside within a disk drive controller 408 as shown. The memory may store a set of instructions, computer (or machine) readable code, or software that implements the one or more algorithms previously described in relation to FIGS. 2A and 2B, FIGS. 3A, 3B, and 3C. The memory may comprise a random access memory such as a DRAM. The memory 412 may interact with the processor 416, such that the processor 416 executes the software. When the software is executed, the one or more algorithms may be employed such that reading and writing of data using the disk drive may be accomplished. The processor 416 may interact with the disk interface 420 such that appropriate reading or writing onto the disk media 424 may occur. The disk interface 420 may comprise necessary electronics used for reading and writing to and from the disk media 424. The disk interface 420 may provide control to a transducer and a read/write head used for reading or writing to and from the disk media 424. The disk interface 420 may be controlled by execution of the software resident in the memory 412. The mapping from LBA to physical location on the disk media, and the appropriate reading and writing of required fractional sectors may be performed when the software is executed. The disk media 424 may comprise a magnetic media material capable of storing data symbols when a read/write head performs a read or write operation. The data symbols may be indexed by way of using cylinder, head, sector, and offset information.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiments disclosed, but that the invention will include all embodiments falling within the scope of the appended claims.

What is claimed is:

1. A method of increasing storage capacity of a disk drive comprising:
   mapping defective and non-defective fractional sectors of one or more data sectors by way of storing a table of entries which specifies locations of said defective and non-defective fractional sectors into a memory;
   using said non-defective fractional sectors of said one or more data sectors to perform a read or write operation, wherein the size of each of said defective and non-defective fractional sectors is determined using an expected defect size.

2. The method of claim 1 wherein said mapping of said defective and non-defective fractional sectors is performed by using said table of entries, said table of entries comprising pairs of values, each of said pairs of values corresponding to a first number of consecutive defective fractional sectors and a second number of consecutive non-defective fractional sectors encountered in said one or more data sectors.

3. The method of claim 1 wherein each of said fractional sectors comprises 256 bytes and each of said one or more data sectors comprises 1024 bytes.

4. The method of claim 1 wherein said disk drive comprises a magnetic hard disk drive.

5. The method of claim 1 wherein said using said non-defective fractional sectors comprises:
   storing data into and reading data from said disk drive by way of translating a logical block address into a physical starting location such that one or more data symbols may be stored into or accessed from said non-defective fractional sectors during said read or write operation.

6. The method of claim 5 wherein said mapping of said non-defective and defective fractional sectors comprises:
   first identifying a first number of consecutive non-defective fractional sectors of said non-defective fractional sectors prior to encountering a defective fractional sector;
   determining a number of data symbols capable of being stored into or accessed from said consecutive non-defective fractional sectors; and
   second identifying a second number of consecutive defective fractional sectors prior to encountering a non-defective fractional sector.

7. The method of claim 6 wherein said first number and said second number is stored in said memory as a paired entry in a table.

8. The method of claim 6 wherein said translating said logical block address into a physical starting location further comprises:
   identifying one or more servo sectors in a track of said disk drive.

9. The method of claim 8 wherein said translating said logical block address into a physical starting location further comprises:
   identifying one or more frame remainders in a track of said disk drive.

10. A system for performing a read or write operation in a disk drive, said system comprising:
    a processor;
    a memory storing a machine readable code, said machine readable code executed by said processor, wherein said machine readable code is said executed to perform:

translating a starting logical block address into a starting fractional sector of one or more fractional sectors of one or more tracks of said disk drive; and mapping said one or more fractional sectors using a table of entries, said table of entries stored in said memory, wherein each of said one or more fractional sectors is configured to have a size that is based on a typical defect size found in said disk drive, said table of entries used for tracking and indexing said one or more fractional sectors when performing said read or write operation, said table of entries comprising pairs of values corresponding to a first number of consecutive non-defective fractional sectors and a second number of consecutive defective fractional sectors.

11. The system of claim 10 wherein said one or more fractional sectors comprises one or more primary defects.

12. The system of claim 10 wherein said one or more fractional sectors are not defective and are capable of storing one or more data symbols.

13. The system of claim 10 wherein said execution of said machine readable code further processes one or more servo sectors of said track in said disk drive.

14. The system of claim 10 wherein said execution of said machine readable code further processes one or more frame remainders of said track in said disk drive.

15. The system of claim 10 wherein one or more data symbols may be stored into or accessed from said consecutive non-defective fractional sectors during said read or write operation.

16. The system of claim 15 wherein said mapping said one or more fractional sectors using a table of entries comprises:
first identifying said consecutive non-defective fractional sectors prior to encountering a defective fractional sector;
determining the number of data symbols capable of being stored into or accessed from said consecutive non-defective fractional sectors; and
second identifying a consecutive number of defective fractional sectors prior to encountering a non-defective fractional sector, wherein said defective fractional sectors are not used for said read or write operation.

17. The system of claim 16 wherein said first number and said second number are stored as a paired entry in said table of entries.

18. The system of claim 10 wherein execution of said machine readable code comprises determining a number of symbols used in said consecutive non-defective fractional sectors for performing said read or write operation.

19. A system for increasing storage capacity of a disk drive comprising:
a memory for storing software; and
a processor for executing said software, wherein said executing performs:
mapping defective and non-defective fractional sectors of one or more data sectors into said memory by way of storing a table of entries which specifies locations of said defective and non-defective fractional sectors; and
using said non-defective fractional sectors of said one or more data sectors to perform a read or write operation, wherein the size of each of said defective and non-defective fractional sectors is determined using an expected defect size.

20. The system of claim 19 wherein said mapping of said defective and non-defective fractional sectors is performed by using said table of entries stored in said memory, said table of entries comprising pairs of values, each of said pairs of values corresponding to a first number of consecutive defective fractional sectors and a second number of consecutive non-defective fractional sectors encountered in said one or more data sectors.

21. The system of claim 19 wherein each of said fractional sectors comprises 256 bytes and each of said one or more data sectors comprises 1024 bytes.

22. The system of claim 19 wherein said disk drive comprises a magnetic hard disk drive.

23. The system of claim 19 wherein said using said non-defective fractional sectors comprises:
storing data into and reading data from said disk drive by way of translating a logical block address into a physical starting location such that one or more data symbols may be stored into or accessed from said non-defective fractional sectors during said read or write operation.

24. The system of claim 23 wherein said mapping of said non-defective and defective fractional sectors comprises:
first identifying a first number of consecutive non-defective fractional sectors of said non-defective fractional sectors prior to encountering a defective fractional sector;
determining a number of data symbols capable of being stored into or accessed from said consecutive non-defective fractional sectors; and
second identifying a second number of consecutive defective fractional sectors prior to encountering a non-defective fractional sector.

25. The system of claim 24 wherein said first number and said second number is stored in said memory as a paired entry in a table.

26. The system of claim 24 wherein said translating said logical block address into a physical starting location further comprises:
identifying one or more servo sectors in a track of said disk drive.

27. The system of claim 26 wherein said translating said logical block address into a physical starting location further comprises:
identifying one or more frame remainders in a track of said disk drive.

28. A method for performing a read or write operation in a disk drive, said method comprising:
translating a starting logical block address into a starting fractional sector of one or more fractional sectors of one or more tracks of said disk drive; and
mapping said one or more fractional sectors using a table of entries, said table of entries stored in a memory, wherein each of said one or more fractional sectors is configured to have a size that is based on a typical defect size found in said disk drive, said table of entries used for tracking and indexing said one or more fractional sectors when performing said read or write operation, said table of entries comprising pairs of values corresponding to a first number of consecutive non-defective fractional sectors and a second number of consecutive defective fractional sectors.

29. The method of claim 28 wherein said one or more fractional sectors comprises one or more primary defects.

30. The method of claim 28 wherein said one or more fractional sectors are not defective and are capable of storing one or more data symbols.

31. The method of claim 28 comprising processing one or more servo sectors of said track in said disk drive.

32. The method of claim 28 comprising processing one or more frame remainders of said track in said disk drive.

33. The method of claim 28 wherein one or more data symbols may be stored into or accessed from said consecutive non-defective fractional sectors during said read or write operation.

34. The method of claim 33 wherein said mapping said one or more fractional sectors using a table of entries comprises:
first identifying said consecutive non-defective fractional sectors prior to encountering a defective fractional sector;
determining the number of data symbols capable of being stored into or accessed from said consecutive non-defective fractional sectors; and
second identifying a consecutive number of defective fractional sectors prior to encountering a non-defective fractional sector, wherein said defective fractional sectors are not used for said read or write operation.

35. The method of claim 34 wherein said first number and said second number are stored as a paired entry in said table of entries.

36. The method of claim 28 comprising determining a number of symbols used in said consecutive non-defective fractional sectors for performing said read or write operation.

* * * * *